(12) United States Patent  
Nasser-Ghodsi

(10) Patent No.: US 8,188,451 B1
(45) Date of Patent: May 29, 2012

(54) ELECTRON GENERATION AND DELIVERY SYSTEM FOR CONTAMINATION SENSITIVE EMITTERS

(75) Inventor: Mehran Nasser-Ghodsi, Hamilton, MA (US)

(73) Assignee: KLA-Tencor Corporation, San Jose, CA (US)

( * ) Notice: Subject to any disclaimer, the term of this patent is extended or adjusted under 35 U.S.C. 154(b) by 173 days.

(21) Appl. No.: 12/561,969

(22) Filed: Sep. 17, 2009

Related U.S. Application Data

(60) Provisional application No. 61/099,870, filed on Sep. 24, 2008.

(51) Int. Cl.
*H01J 1/304* (2006.01)
*H01J 3/12* (2006.01)
(52) U.S. Cl. ........................... 250/493.1; 315/94
(58) Field of Classification Search .................. None
See application file for complete search history.

(56) References Cited

U.S. PATENT DOCUMENTS 3,786,268 A * 1/1974 Nomura .................. 250/311
2007/0158588 A1 * 7/2007 Zhou et al. .............. 250/492.2
* cited by examiner

*Primary Examiner* — Jack Berman
*Assistant Examiner* — Eliza Osenbaugh-Stewart
(74) *Attorney, Agent, or Firm* — Joshua D. Isenberg; JDI Patent

(57) ABSTRACT

Contamination may be removed from an emitter tip of a field emitter during operation of the emitter tip in a system having an electron beam column having an electrode with a beam defining aperture, an electron collector located proximate to the beam defining aperture between the electrode and the field emitter, and an electron deflector located between the emitter tip and the electron collector. At regular predetermined intervals an electron beam from the emitter tip may be deflected away from a path through the beam defining aperture and onto the electron collector. An electron beam current to the electron collector may be determined and the emitter tip may be flash heated if the current to the electron collector is below a threshold.

16 Claims, 3 Drawing Sheets

ELECTRON GENERATION AND DELIVERY SYSTEM FOR CONTAMINATION SENSITIVE EMITTERS

CLAIM OF PRIORITY

This application claims the priority benefit of provisional application No. 61/099,870 to Mehran Nasser-Ghodsi entitled "ELECTRON GENERATION AND DELIVERY SYSTEM FOR CONTAMINATION SENSITIVE EMITTERS" filed Sep. 24, 2008, the entire contents of which are incorporated herein by reference.

FIELD OF THE INVENTION

This invention generally relates electron generation system and more particularly to a cold field emitter (CFE) system with improved performance.

BACKGROUND OF THE INVENTION

There has been an increasing need for the electron/ion beam equipment that can be operated at low voltages. The cold field emitter (CFE) provides a stable electron beam and has a long lifetime for conventional electron microscopy and electron beam lithography. Cold field-emission cathode units produce electron beams with higher current density and with lower energy spread than thermionic cathodes.

A cold field emitter for producing an electron beam includes at least one cold cathode unit. Each of the cold cathode units includes an emitter cone having an emitter tip and a gate spaced apart from the emitter tip for extracting electrons from the emitter tip in a propagation direction upon application of a positive dc voltage on the gate with respect to the emitter tip. Each of the cold cathode units also includes a lens electrode disposed further in the propagation direction from the emitter tip than the gate for focusing the extracted electrons in the propagation direction. The emitter tip may be a single crystal tungsten tip. Single crystal hafnium carbides (HfC) and other metal carbides (TiC, NbC, etc) are used as alternative to W for the use as an electron emitter.

Conventional electron generation systems using cold field emitters with W or HfC tips are based on the operation of the tips until states of instability are arrived at. These instabilities, which are typically caused by surface contamination, result in increased current ultimately causing tip failure. Therefore once the beam current starts to demonstrate instabilities, the tip is flashed with a long settling time and the process is refreshed.

The current operating modes of the conventional electron generation system result in extended down time between tip flash to allow for beam stabilization. In addition, to reduce the rate of contamination adsorption on tip surface, ultra high vacuum (UHV) is required.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Embodiments of the present invention is based on standard electron beam (e-beam) gun designs with an additional beam defining/current measurement aperture included in the optical column and beam deflection on to the aperture as part of the operation of the electron gun. Flashing of the emitter is initiated at preset periods of time before beam current drift has started. This allows the emitter tip to operate in vacuum environments with less stringent vacuum requirements than UHV.

Figure 1A:
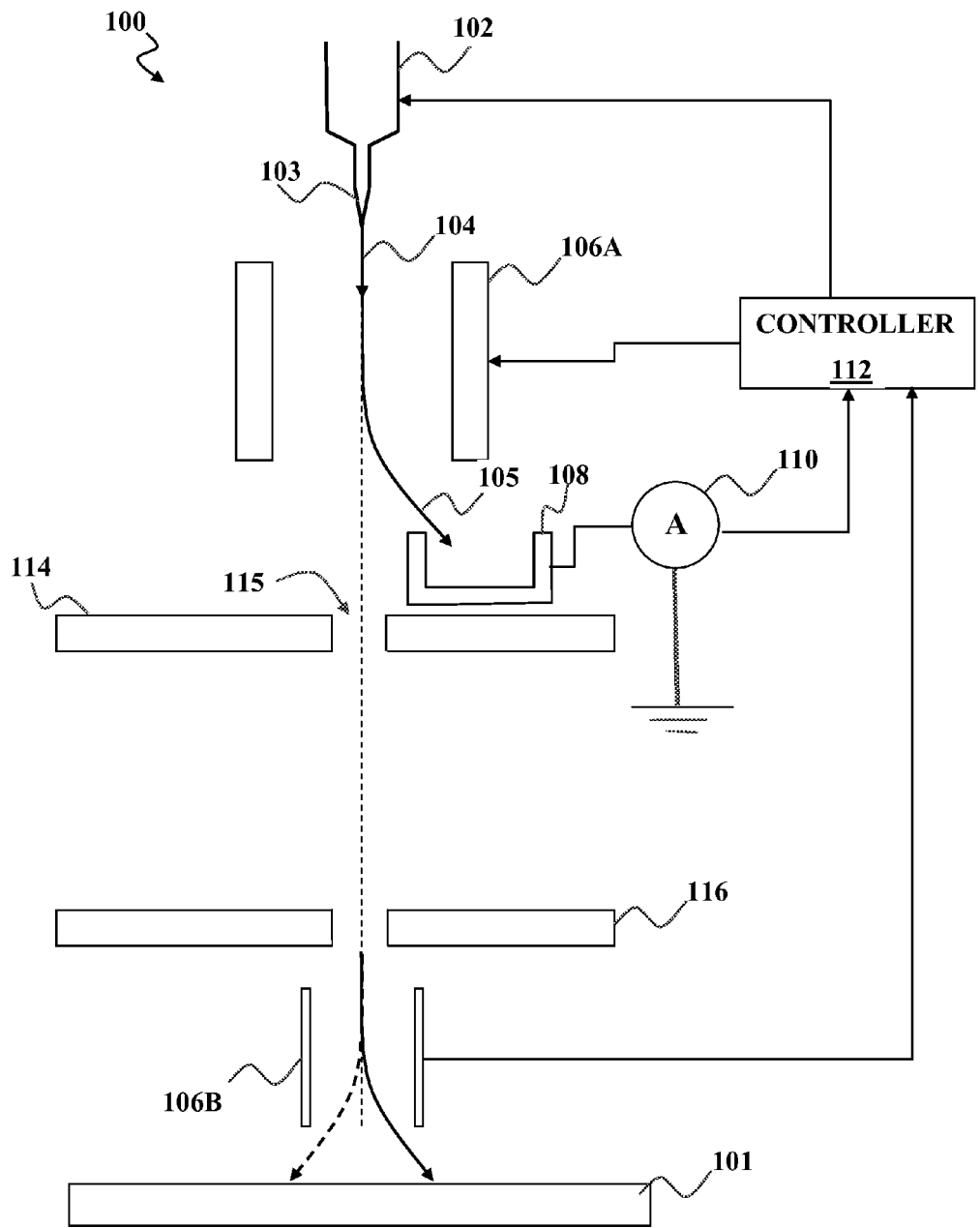
FIG. 1A is a schematic diagram of an electron generation system according to an embodiment of the present invention.

FIG. 1A is a schematic diagram of an electron beam system 100 according to an embodiment of the present invention. The electron generation system 100 is preferably a cold field emitter (CFE) 102, which includes at least one cold field-emission cathode unit, for producing an electron beam 104. An exemplary field emitter 102 is a vacuum cone-type field emitter. The cold cathode unit 102 emits an electron beam 104 from the tip 103. Electrons from the emitter tip are focused on to a sample 101 by an electron optical column having one or more electrodes 114, 116. The electron generation system 100 also includes an electron deflector 106A located between the emitter tip 103 and an electrode 114 having a beam-defining aperture 115.

The deflector 106A deflects the electron beam 104 from the emitter 102 away from a beam path 105 through the aperture 115 and onto an electron detector 108, such as a Faraday cup. By way of example deflector 106A may be an electrostatic deflector having a pair of electrodes with a gap between them. The gap may be aligned with the beam defining aperture 115. Alternatively, the deflector 106A may be a magnetic deflector having one or more deflection coils that produce magnetic fields that deflect the electron beam 104 onto the electron collector 108. The electron collector 108 can be located either before or after beam defining aperture (BDA) 115.

According to an embodiment of the invention, the electron collector 108 may be electrically connected to a current meter 110 which is connected to a controller 112. The deflector 106A and emitter 102 may operate in response to electrical signals from the controller 112. The outputs from the controller 112 that provide control signals to the emitter 102 and deflectors may be coupled to the electron collector 108 in a closed feedback loop. The controller 112 may be configured, e.g., by appropriate circuitry or programming to control the flashing of the emitter tip 103 based on regular measurements of the beam current with the Faraday cup 108. The system 100 may optionally include an additional electron deflector 106B which may be located between the electrode 114 and the sample 101. The additional deflector 106B may be an electrostatic or magnetic deflector. The additional deflector 106B may be used to deflect the electron beam 104 to sweep the electron beam over the sample 101.

Figure 1B:
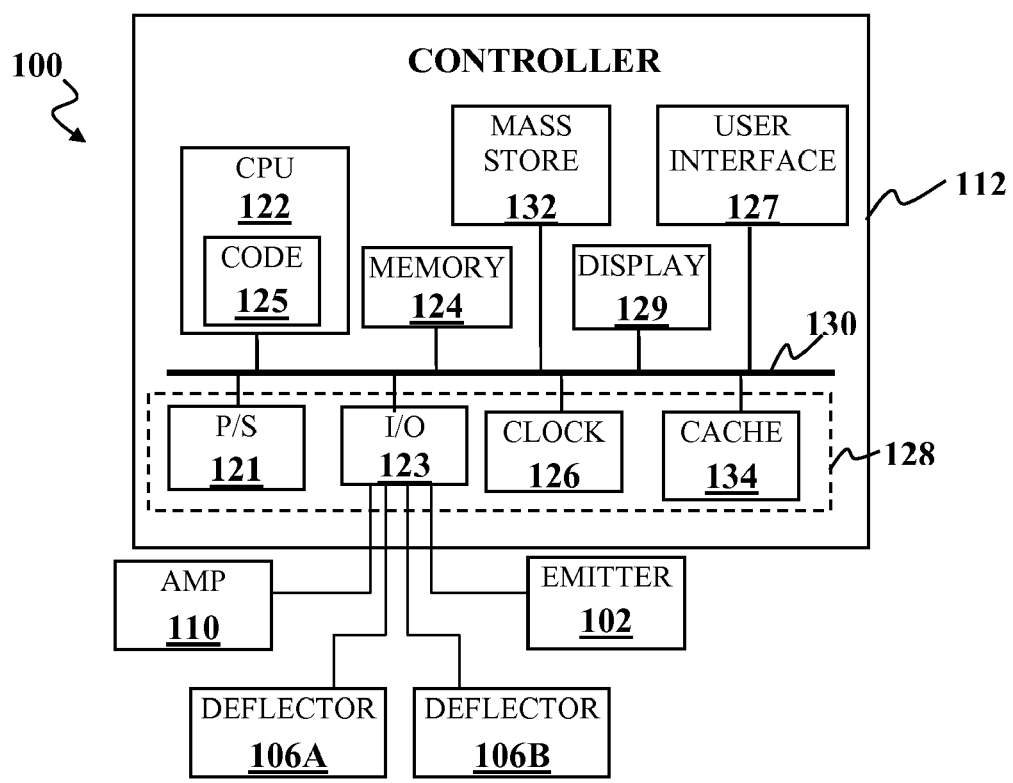
FIG. 1B is a block diagram of the system of FIG. 1A.

By way of example, as shown in the block diagram of FIG. 1B, the controller 112 may be a self-contained microcontroller. Alternatively, the controller 112 may be a general purpose computer configured to include a central processor unit (CPU) 122, memory 124 (e.g., RAM, DRAM, ROM, and the like) and well-known support circuits 128 such as power supplies 121, input/output (I/O) functions 123, clock 126, cache 134, and the like, coupled to a control system bus 130. The memory 124 may contain instructions that the CPU 122 executes to facilitate the performance of the system 100. The instructions in the memory 124 may be in the form of the program code 125. The code 125 may control the flashing of the electron emitter 102 as described below with respect to FIG. 2.

The code 125 may conform to any one of a number of different programming languages such as Assembly, C++, JAVA or a number of other languages. The controller 112 may also include an optional mass storage device, 132, e.g., CD-ROM hard disk and/or removable storage, flash memory, and the like, which may be coupled to the control system bus 130. The controller 112 may optionally include a user interface 127, such as a keyboard, mouse, or light pen, coupled to the CPU 122 to provide for the receipt of inputs from an operator (not shown). The controller 112 may also optionally include a display unit 129 to provide information to the operator in the form of graphical displays and/or alphanumeric characters under control of the processor unit 122. The display unit 129 may be, e.g., a cathode ray tube (CRT) or flat screen monitor.

The controller 112 may receive information, i.e., electron beam current value, from the current meter 110 through the I/O functions 123 in response to data and program code instructions stored and retrieved by the memory 124. Depending on the configuration or selection of controller 112, the emitter 102 may interface with the I/O functions via conditioning circuits. The conditioning circuits may be implemented in hardware or software form, e.g., within code 125. It is noted that in some embodiments, the current meter 110 may be a separate unit that is connected to signal input of the controller. Alternatively, the current meter may be an integral part of the controller 112. In either case, for the purposes of the present application, the current meter 110 may be said to be connected to the controller.

Figure 2:
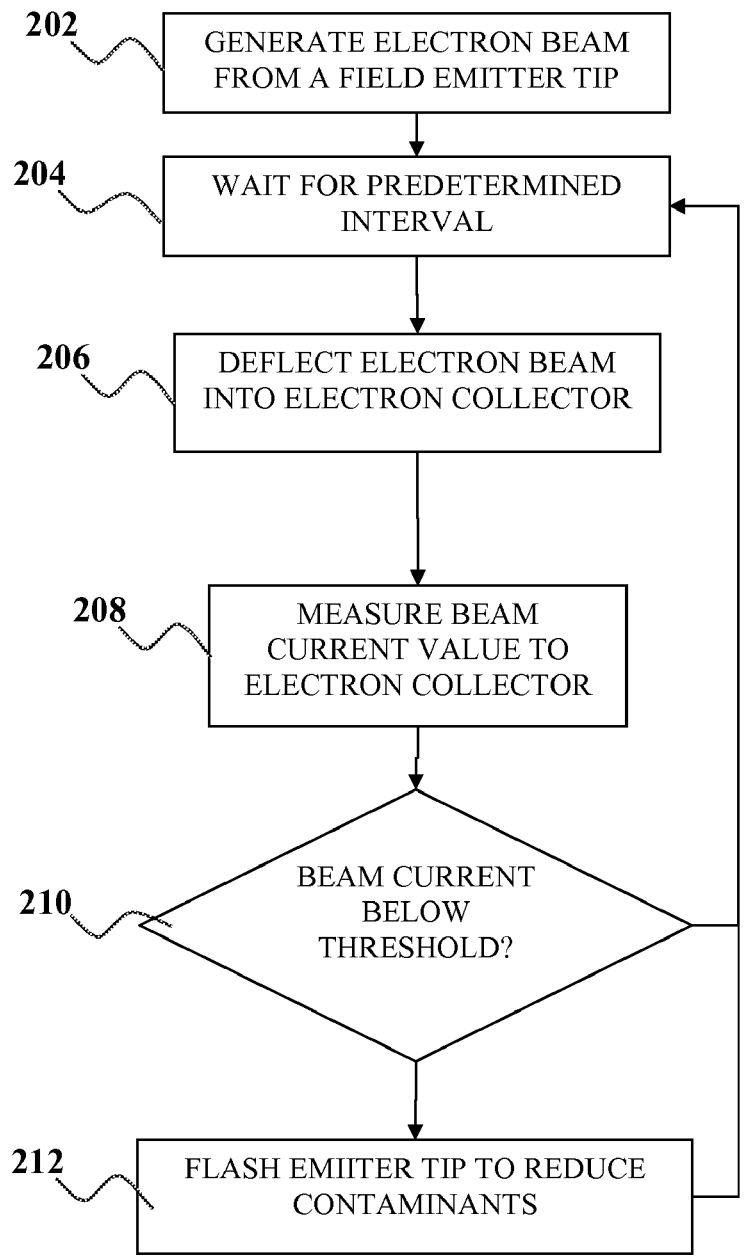
FIG. 2 is a flow diagram illustrating a method for cleaning the emitter tip of a cold field emitter according to a preferred embodiment of the present invention.

FIG. 2 is a flow diagram illustrating a method 200 for regularly flashing the emitter tip to clean the contaminants. As shown in FIG. 2, an electron beam is generated from the emitter tip 103 of the field emitter 102 as indicated at 202. After waiting for a predetermined interval, as indicated at 204, the electron deflector 106A may deflect the electron beam 104 in to the electron collector 108 as indicated at 206. In some embodiments, the electron beam 104 may be swept over the sample in a regularly repeated pattern having a characteristic cycle time. By way of example, the controller 112 may be configured, e.g., by suitable programming, to cause the additional deflector 106B to sweep the electron beam 104 over the sample 101 repeatedly in a predetermined pattern. The controller 112 may be further configured to cause the electron deflector 106A to deflect the electron beam 104 away from beam path 105 and onto the electron collector 108 at an end of a cycle of the predetermined pattern. For example, the controller 112 may sweep the electron beam over the sample 101 in a raster pattern and the electron beam 104 may be measured at end of each raster trace, e.g., every 15 ms to 35 ms.

The beam current collected by the electron collector 108 is measured, e.g., by a current meter 110, as indicated at 208. At 210 the measured beam current value may be compared to a threshold value. Based on the beam current value sent from the current meter, the controller 112 may control flashing of the emitter tip to clean contaminants as indicated at 212, which closes the feedback loop. By way of example, the emitter tip 103 may be flashed at elevated temperature of about 2100K to 2400K, e.g., by providing sufficient electrical current to the field emitter 102. The method 200 allows to flashing the emitter tip regularly, thereby the electron generation system can operate at lower vacuum. The predetermined interval and threshold current may be empirically determined such that the flash heating in 212 is sufficient to remove contaminants built up on the emitter tip 103 during the predetermined interval when the emitter tip 103 is operated in an environment at a pressure of between $10^{-6}$ torr and $10^{-7}$ torr.

Regularly monitoring electron beam current with electron collector allows for regular tracking the performance of the electron emitter so that the emitter tip may be flash heated as needed. By monitoring the beam current at regular intervals and regularly flash heating the emitter tip, the tip can be operated at high vacuum, e.g., at environmental pressure between $10^{-6}$ torr and $10^{-8}$ torr as opposed to ultra-high vacuum (UHV), which typically requires pressures of $10^{-9}$ torr or less.

An electron beam system that can operate at a lower level of vacuum can be used with simpler and less expensive vacuum systems. This allows electron beam systems that use field emitter tips to be incorporated into high volume vacuum processing environments, such as semiconductor processing systems.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. An electron beam system, comprising:
    a field emitter including an emitter tip configured to generate an electron beam;
    an electron beam column having an electrode with a beam defining aperture;
    an electron collector located proximate to the beam defining aperture; between the electrode and the field emitter;
    an electron deflector located between the emitter tip and the electron collector; and
    a controller coupled to the field emitter, electron collector and deflector, wherein the controller is configured to, at regular predetermined intervals to:
    i) cause the electron deflector to deflect the electron beam away from a path through the beam defining aperture and onto the electron collector;
    ii) determine an electron beam current to the electron collector; and
    iii) cause the emitter tip to flash heat if the current to the electron collector is below a threshold, wherein the predetermined interval and the threshold current is selected such that the flash heating is sufficient to remove contaminants built up on the emitter tip during the predetermined interval when the emitter tip is operated in an environment at a pressure that lies within a range between $10^{-6}$ torr and $10^{-8}$ torr.

2. The system of claim 1, wherein the electron deflector is an electrostatic deflector.

3. The system of claim 2 wherein the electrostatic deflector includes first and second electrodes with a gap therebetween, wherein the gap is aligned with the beam defining aperture.

4. The system of claim 2 wherein the electron deflector is a magnetic deflector.

5. The system of claim 1 wherein the field emitter, electron collector and controller are connected in a closed feedback loop.

6. The system of claim 1 wherein the controller is configured to provide sufficient electrical current to the field emitter to heat the emitter tip to a temperature of about 2100K to 2400K.

7. The system of claim 1, further comprising an additional electron deflector disposed between the electrode and a sample, wherein the additional electron deflector is coupled to the controller, wherein the controller is configured to cause the additional deflector to sweep the electron beam over the sample repeatedly in a predetermined pattern.

8. The system of claim 7 wherein the controller is configured to cause the electron deflector to deflect the electron beam away from a path through the beam defining aperture and onto the electron collector at an end of a cycle of the predetermined pattern.

9. The system of claim 1 wherein the controller is configured to determine the electron beam current to the electron collector every 15 ms to 35 ms.

10. In an electron beam system having a field emitter with an emitter tip configured to generate an electron beam, an electron beam column having an electrode with a beam defining aperture, an electron collector located proximate to the beam defining aperture; between the electrode and the field emitter, and an electron deflector located between the emitter tip and the electron collector, a method for removing contamination from the emitter tip during operation of the emitter tip, comprising at regular predetermined intervals:
   a) deflecting the electron beam away from a path through the beam defining aperture and onto the electron collector;
   b) determining an electron beam current to the electron collector; and
   c) flash heating the emitter tip if the current to the electron collector is below a threshold, wherein the predetermined interval and the threshold current is selected such that the flash heating is sufficient to remove contaminants built up on the emitter tip during the predetermined interval when the emitter tip is operated in an environment at a pressure that lies within a range between $10^{-6}$ torr and $10^{-8}$ torr.

11. The method of claim 10 wherein c) includes heating the emitter tip to a temperature of about 2100K to 2400K.

12. The method of claim 10, further comprising directing the electron beam onto a target in a predetermined pattern and wherein a) includes deflecting the electron beam away from the path through the beam defining aperture and onto the electron collector at an end of a cycle of the predetermined pattern.

13. The method of claim 10 wherein b) includes determining the electron beam current to the electron collector every 15 ms to 35 ms.

14. The method of claim 10 wherein the predetermined interval and the threshold current is selected such that the flash heating in c) is sufficient to remove contaminants built up on the emitter tip during the predetermined interval when the emitter tip is operated in an environment at a pressure of between $10^{-6}$ torr and $10^{-7}$ torr.

15. The method of claim 14 wherein the field emitter, electron collector and controller are connected in a closed feedback loop.

16. In an electron generation system having a field emitter with an emitter tip configured to generate an electron beam, an electron beam column having an electrode with a beam defining aperture, an electron collector located proximate to the beam defining aperture; between the electrode and the field emitter, and an electron deflector located between the emitter tip and the electron collector, a system for removing contamination from the emitter tip during operation of the emitter tip, comprising means for at regular predetermined intervals:
   a) deflecting the electron beam away from a path through the beam defining aperture and onto the electron collector;
   b) determining an electron beam current to the electron collector; and
   c) flash heating the emitter tip if the current to the electron collector is below a threshold, wherein the predetermined interval and the threshold current is selected such that the flash heating is sufficient to remove contaminants built up on the emitter tip during the predetermined interval when the emitter tip is operated in an environment at a pressure that lies in a range between $10^{-6}$ torr and $10^{-8}$ torr.

* * * * *